(12) United States Patent
Hiyama et al.

(10) Patent No.: US 7,547,871 B2
(45) Date of Patent: Jun. 16, 2009

(54) PHOTOELECTRIC CONVERSION DEVICE

(75) Inventors: Hiroki Hiyama, Kanagawa (JP); Toru Koizumi, Kanagawa (JP); Katsuhito Sakurai, Tokyo (JP); Masaru Fujimura, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 642 days.

(21) Appl. No.: 11/205,060

(22) Filed: Aug. 17, 2005

(65) Prior Publication Data

US 2005/0268960 A1 Dec. 8, 2005

Related U.S. Application Data

(62) Division of application No. 10/372,286, filed on Feb. 25, 2003, now Pat. No. 6,960,751.

(30) Foreign Application Priority Data

Feb. 27, 2002 (JP) ............................. 2002-051492

(51) Int. Cl.
*H01L 27/00* (2006.01)
*H01L 31/00* (2006.01)

(52) U.S. Cl. ................. 250/208.1; 250/214.1; 348/308; 257/443

(58) Field of Classification Search ............. 250/208.1, 250/214.1; 348/308; 257/443
See application file for complete search history.

(56) References Cited

U.S. PATENT DOCUMENTS

| | | | |
|---|---|---|---|
| 4,556,908 A | 12/1985 | Ida | 348/302 |
| 4,959,723 A | 9/1990 | Hashimoto | 348/302 |
| 5,264,727 A | 11/1993 | Kudou et al. | 257/734 |
| 5,336,915 A | 8/1994 | Fujita et al. | 257/369 |
| 5,537,075 A | 7/1996 | Miyazaki | 327/566 |
| 6,081,350 A * | 6/2000 | Aizawa et al. | 358/468 |
| 6,452,632 B1 | 9/2002 | Umeda et al. | 348/294 |
| 2001/0023949 A1 | 9/2001 | Johnson et al. | 257/222 |
| 2003/0164887 A1 | 9/2003 | Koizumi et al. | 348/308 |

FOREIGN PATENT DOCUMENTS

| | | |
|---|---|---|
| EP | 0 541 332 A1 | 5/1993 |
| EP | 0 905 788 A2 | 3/1999 |
| JP | 63 055980 A | 3/1988 |

OTHER PUBLICATIONS

Patent Abstracts of Japan, vol. 013, No. 243 (Jun. 7, 1989), of Kokai 01-044131A (Feb. 16, 1989).

* cited by examiner

*Primary Examiner*—Arun S Phasge
(74) *Attorney, Agent, or Firm*—Fitzpatrick, Cella, Harper & Scinto (57) ABSTRACT

A photoelectric conversion device formed on a single semiconductor substrate, including: a plurality of photoelectric conversion elements; a read-out circuit including a switch for reading out analog signals from the photoelectric conversion elements; a buffer circuit for driving the switch; and a logic circuit for processing digital signals. A first semiconductor area to which a ground level for the buffer circuit is supplied and a second semiconductor area to which a ground level for the logic circuit is supplied are electrically separated from each other.

13 Claims, 9 Drawing Sheets

PHOTOELECTRIC CONVERSION DEVICE

CROSS-REFERENCE TO RELATED APPLICATION

This application is a divisional of U.S. patent application Ser. No. 10/372,286, filed Feb. 25, 2003, now U.S. Pat. No. 6,960,751, the entire disclosure of which is incorporated herein by reference.

BACKGROUND OF THE INVENTION

1. Field of the Invention

The present invention relates to a photoelectric conversion device used for a scanner, a video camera, a digital still camera etc.

2. Related Background Art

Figure 8:
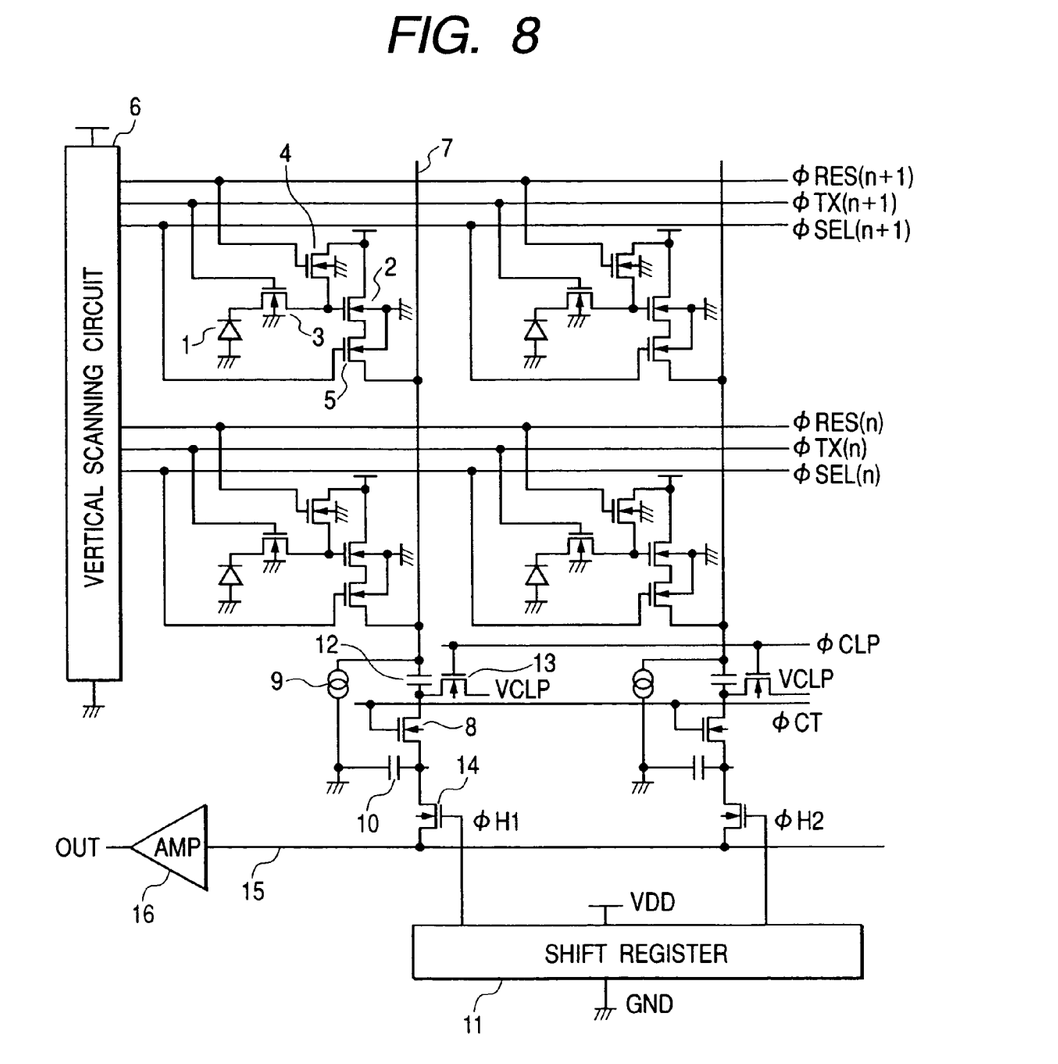
FIG. 8 is a conceptual diagram showing an equivalent circuit of a photoelectric conversion device according to a conventional art.

In recent years, a photoelectric conversion device called a CMOS sensor provided using a CMOS process has been a focus of attention. Use of the CMOS sensor particularly in a field of portable information devices is expected because of its easy loading together with peripheral circuits, low voltage driving etc. FIG. 8 shows an equivalent circuit of a photoelectric conversion device according to a conventional art. In the drawing, pixels are arranged in 2×2 array, but the pixels are not particularly limited to this array. In FIG. 8, a unit pixel includes a photodiode 1 which is a photoelectric conversion element, an amplification metal oxide silicon field effect transistor (MOSFET) 2 for amplifying a signal generated at the photodiode 1, a reset switch 4 for resetting an input of the amplification MOSFET 2 to predetermined voltage, and a select switch 5 for controlling electrical connection between a source electrode of the amplification MOSFET 2 and a vertical output line 7. Additionally, a transfer switch 3 is installed to control electrical connection between the photodiode 1 and a gate electrode of the amplification MOSFET 2.

Figure 9:
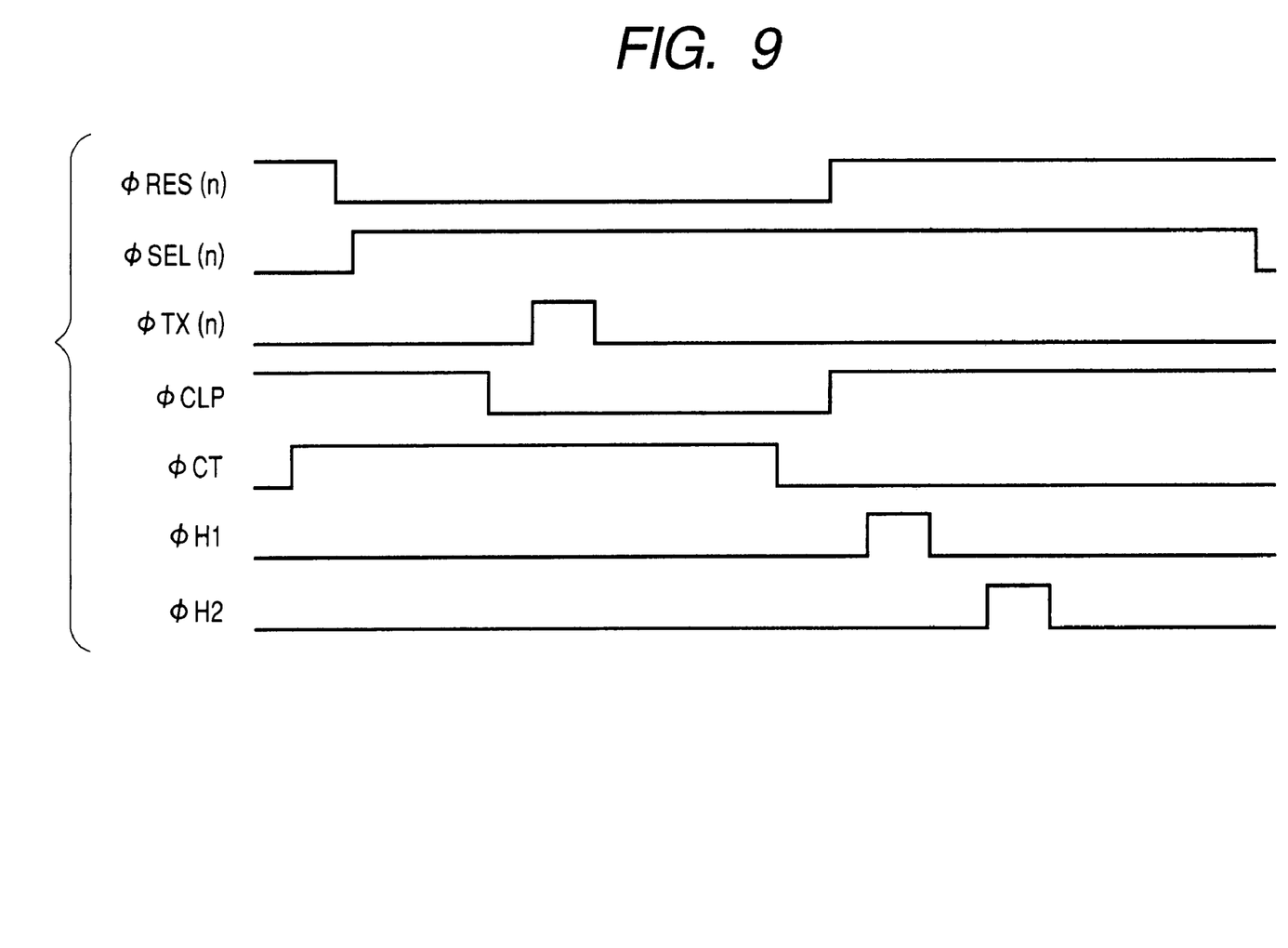
FIG. 9 is a view showing a driving pulse timing common to the photoelectric conversion devices of the conventional art and the embodiments.

An operation of the photoelectric conversion device will be described by using a timing chart of FIG. 9. When a vertical scanning circuit 6 selects a given line (referred to as n line hereinafter), first, a reset signal φRES(n) becomes low to turn OFF the reset switch. Then, a select signal φSEL(n) becomes high to turn ON the select switch 5, whereby a source of the amplification MOSFET 2 is electrically connected to the vertical output line 7, a source follower circuit is constituted of a selected pixel and a constant current load 9, and an output corresponding to a pixel reset state appears on the vertical output line 7. The minute that a clamp pulse φCLP becomes low to turn OFF a switch 13, a potential of the vertical output line is clamped by a clamp capacity (C0) 12. Subsequently, a transfer signal φTX becomes high for a fixed period, photoelectric charge is transferred from the photodiode 1 to a gate of the amplification MOSFET 2, and the potential of the vertical output line 7 is changed in accordance with the amount of photoelectric charge. This change is accompanied by a change of a potential of a line holding capacity (CT) 10 from an initial potential VCLP, the amount of which becomes a gain ratio of C0/(C0+CT). The potential change at the line holding capacity CT is established at a point of time when a φCT becomes low to turn OFF a switch 8. Then, signals held by the line holding capacity 10 are sequentially read out to a horizontal output line 15 by horizontal scanning pulses φH1, H2 generated from a horizontal scanning circuit 11. Accordingly, output signals of one line are outputted through an output amplifier 16.

However, in the aforementioned photoelectric conversion device of the conventional art, there are problems described below. Since a number of logic gates are included in the horizontal scanning circuit 11, the minute that a horizontal transfer pulse φH is generated, the logic gates are operated all at once so that through-current flows between a power source VDD and a ground potential GND. This through-current reduces voltage on a power supply path or a ground potential supply path to cause fluctuation in a high level and a low level of the pulse φH, consequently generating noise. This noise is superposed on an optical response signal by capacity coupling between a signal path from the line holding capacity 10 to the horizontal output line 15 and a gate electrode of a horizontal transfer gate 14 to cause S/N deterioration. If events occur in a logic circuit of a sensor peripheral circuit not only at the time of horizontal transfer pulse generation but also at other time, voltages are similarly reduced on the power supply path and the ground potential supply path. The reduced voltages are mixed into the optical response signal by capacity coupling between a group of switches disposed on the signal path, and an analog signal path. Such mixing-in of the logic circuit noise results in greatly-limited S/N characteristics in the conventional photoelectric conversion device.

SUMMARY OF THE INVENTION

An object of the present invention is to obtain high-quality images.

In order to achieve the object, according to an aspect of the present invention, there is provided a photoelectric conversion device formed on a single semiconductor substrate, comprising: a plurality of photoelectric conversion elements; a read-out circuit including a switch for reading out analog signals from the photoelectric conversion elements; a buffer circuit which drives the switch; and a logic circuit which processes digital signals, wherein a first semiconductor area to which a ground level for the buffer circuit is supplied and a second semiconductor area to which a ground level for the logic circuit is supplied are electrically separated from each other.

According to an another aspect of the present invention, there is provided a photoelectric conversion device formed on a single semiconductor substrate, comprising: a plurality of photoelectric conversion elements; a read-out circuit including a switch for reading out analog signals from the photoelectric conversion elements; a buffer circuit which drives the switch; and a logic circuit which processes digital signals, wherein a third semiconductor area to which a power supply level for the buffer circuit is supplied and a fourth semiconductor area to which a power supply level for the logic circuit is supplied are electrically separated from each other.

Other objects and features of the present invention will become apparent upon reading of the following detailed description.

DESCRIPTION OF THE PREFERRED EMBODIMENTS

Next, the preferred embodiments of the present invention will be described in detail.

First Embodiment

Figure 1:
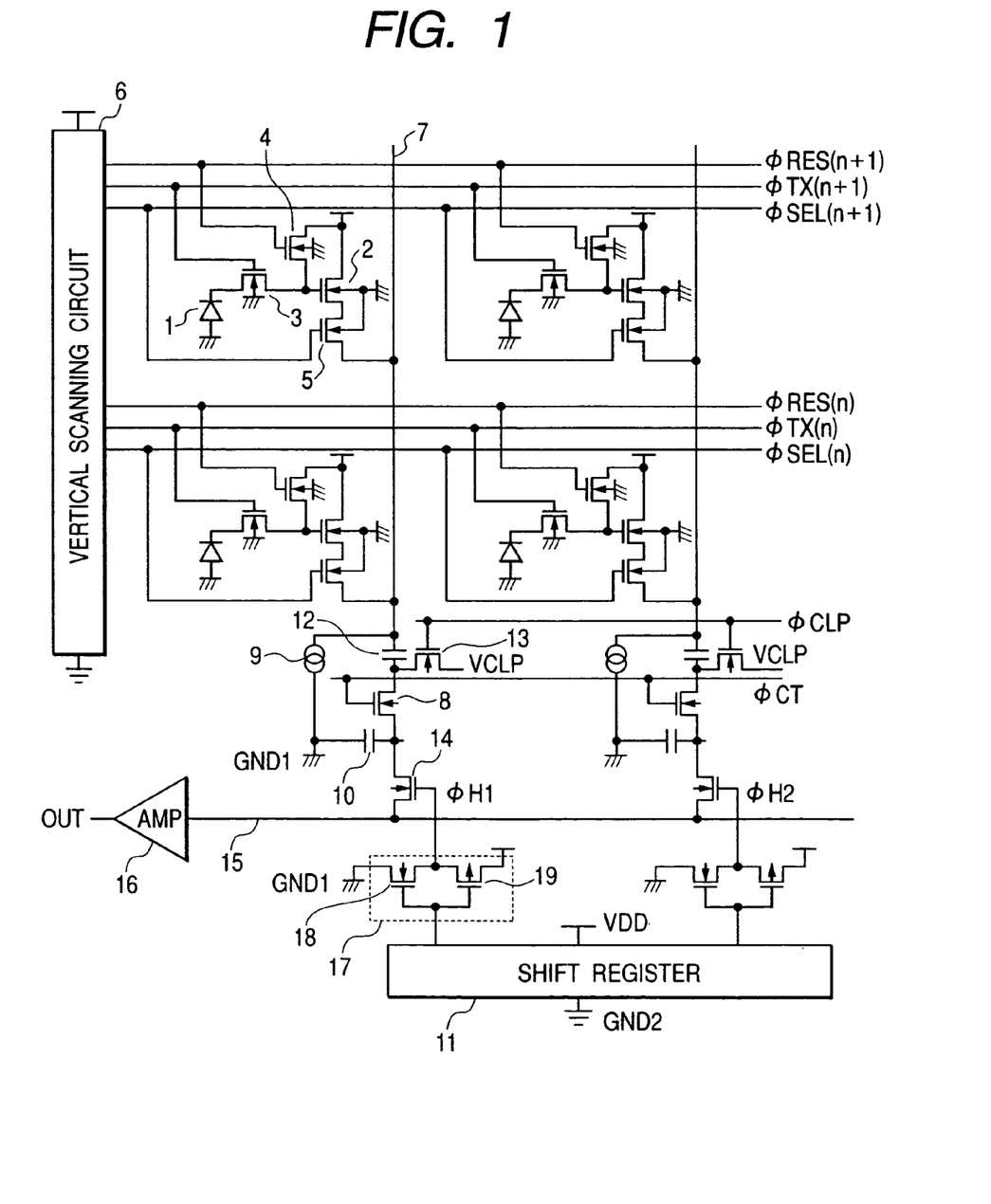
FIG. 1 is a conceptual diagram showing an equivalent circuit of a photoelectric conversion device according to a first embodiment of the present invention.

The first embodiment of the present invention will be described in detail. FIG. 1 is a conceptual diagram showing an equivalent circuit of a photoelectric conversion device of the first embodiment. This photoelectric conversion device is formed on a single semiconductor substrate by, for example a CMOS process.

In the drawing, pixels are arranged in 2×2 array in horizontal and vertical directions, but the pixels are not particularly limited to this array. In FIG. 1, a unit pixel includes a photodiode 1 which is a photoelectric conversion element, an amplification metal oxide semiconductor field effect transistor (MOSFET) 2 for amplifying a signal generated by the photodiode 1, a reset switch 4 for resetting an input of the amplification MOSFET 2 to predetermined voltage, and a select switch 5 for controlling electrical connection between a source electrode of the amplification MOSFET 2 and a vertical output line 7. Additionally, a transfer switch 3 is installed to control electrical connection between the photodiode 1 and a gate electrode of the amplification MOSFET 2.

A reference numeral 6 denotes a vertical scanning circuit for sequential scanning in a vertical direction, 7 denotes a vertical output line to which a signal from a pixel is outputted, and 9 denotes a constant current load constituting a source follower circuit with the amplification MOSFET 2.

A reference numeral 12 denotes a clamp capacity serially connected to the vertical output line, and 13 denotes a switch for fixing one potential of the capacity to a predetermined potential. The components 12 and 13 constitute a clamp circuit.

A reference numeral 8 denotes a transfer switch for transferring a signal from the clamp circuit 13, 10 denotes a holding capacitor for holding a signal from the transfer switch 8, 14 denotes a transfer switch for transferring a signal from the holding capacitor 10 to a horizontal output line 15, and 16 denotes an output amplifier for amplifying a signal from the horizontal output line 15 and outputting it to the outside of the photoelectric conversion device.

A reference numeral 17 denotes a buffer circuit including inverters 18, 19, which drives the transfer switch 3, the reset switch 4, the amplification MOSFET 2, the select switch 5, the vertical output line 7, the constant current load 9, the clamp circuits 12, 13, the switch 8, the holding capacity 10, the switch 14, the horizontal output line 15, and the transfer switch 14 included in a read-out circuit including the output amplifier 16 in order to read out an analog signal from the photoelectric conversion element. A reference numeral 11 denotes a shift register (logic circuit) for processing a digital signal for sequentially supplying pulses to the buffer circuit 17 based on a supplied clock signal, which is constituted by serially connecting a flip-flop 8.

The shift register 11 and the buffer circuit 17 constitute a horizontal scanning circuit. The buffer circuit has an impedance conversion function for setting impedance to drive the transfer switch.

An operation of the aforementioned photoelectric conversion device will be described by using a timing chart of FIG. 8. When a given line (referred to n-th line hereinafter) is selected by the vertical scanning circuit 6, first, a reset signal φRES(n) becomes low to turn OFF the reset switch.

Then, a select signal φSEL(n) becomes high to turn ON the select switch 5. Accordingly, a source of the amplification MOSFET 2 is electrically connected to the vertical output line 7, a source follower circuit is constituted of a selected pixel and the constant current load 9, and an output corresponding to a pixel reset state appears on the vertical output line 7. The minute that a clamp pulse φCLP becomes low to turn OFF the switch 13, a potential of the vertical output line is clamped by the clamp capacity (C0) 12. Subsequently, a transfer signal φTX becomes high for a fixed period, photoelectric charge is transferred from the photodiode 1 to a gate of the amplification MOSFET 2. The potential of the vertical output line 7 is changed in accordance with the photoelectric charge. This change is accompanied by a change of a potential of the line holding capacity (CT) 10 from an initial potential VCLP, the amount of which becomes a gain ratio of C0/(C0+CT).

The potential change of the line holding capacity CT is established at a point of time when the φCT becomes low to turn OFF the switch 8. Then, signals held in the line holding capacity 10 are sequentially read out to the horizontal output line 15 by horizontal scanning pulses φH1, φH2 generated from the shift register 11, whereby output signals of one line are outputted through the output amplifier 16.

In the drawing, there are shown two kinds of ground potential supply paths (GND 1, GND 2). As described later, these are independent ground potential supply paths which do not interfere with each other electrically. A ground potential of the buffer circuit 17 is supplied from the supply path GND 1, i.e., from the path different from the ground potential supply path GND 2 of the shift register 11. Thus, there are no effects of fluctuation in the ground potential caused by through-current during the operation of the shift register 11.

The buffer circuit 17 of the embodiment is constituted of the inverters. However, it may be constituted of a NAND gate etc. That is, the buffer circuit can employ any constitution as long as it can carry out impedance conversion necessary for driving the horizontal transfer gate 14.

Figure 2:
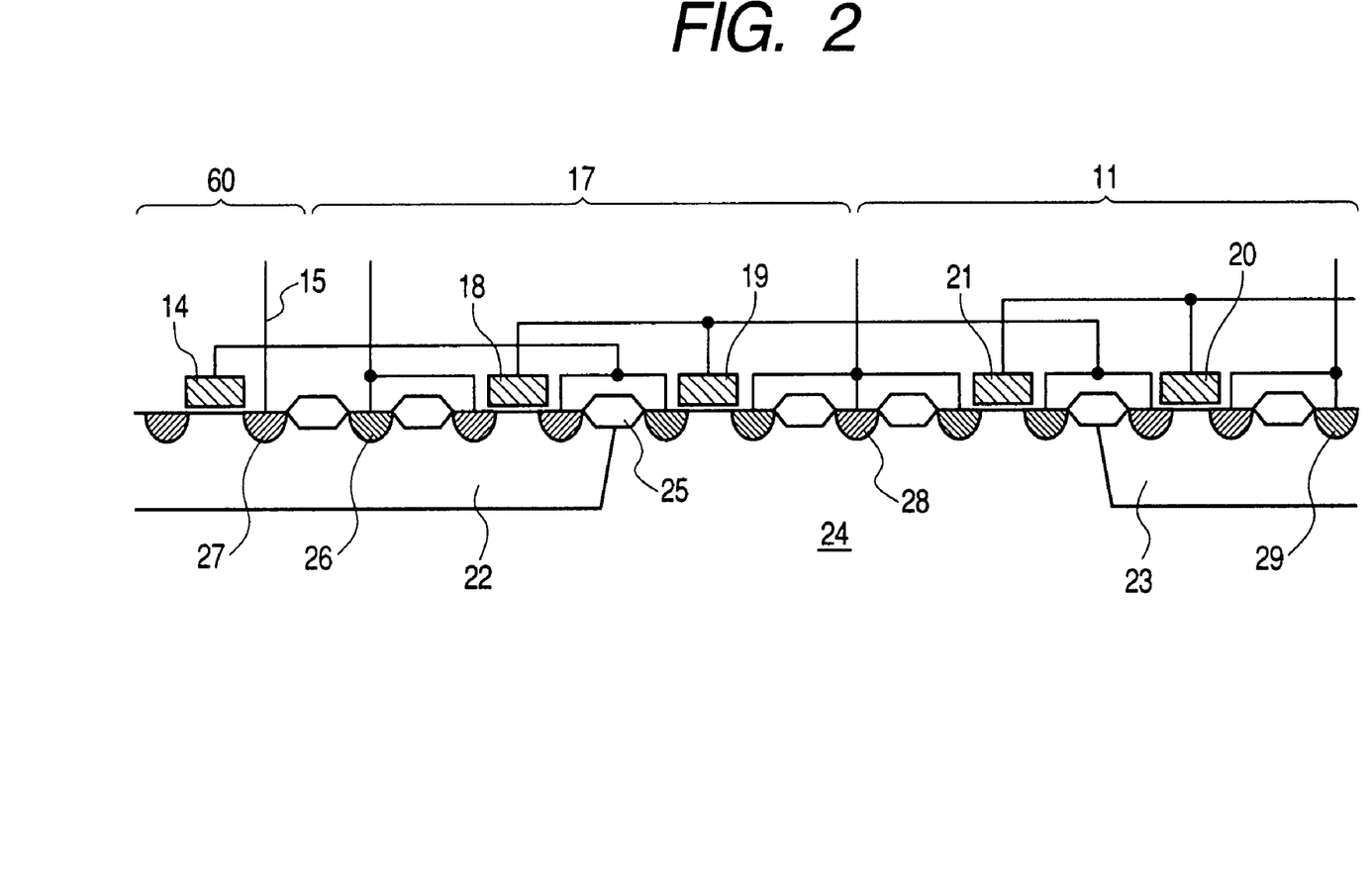
FIG. 2 is a conceptual diagram showing a sectional structure of the photoelectric conversion device of the first embodiment of the invention.

FIG. 2 is a conceptual diagram showing a partial sectional structure of the switch 60, the buffer circuit 17 and the shift register 11 in which respective circuit elements are separated from each other by isolation areas 25. The switch 60 is constituted of an NMOS 14 formed in a first P type well 22. A ground potential is supplied to the first P type well 22 through a P type diffusion layer 26 from the outside. An N type diffusion layer 27 which is a source or a drain of the switch 60 is connected to the horizontal output line 15. An NMOS 18 constituting the buffer circuit 17 is formed in the first P type well 22, and a PMOS 19 is formed in a first N type well 24. A power supply potential VDD is supplied to the first N type well 24 through an N type diffusion layer 28 from the outside. An NMOS 20 and a PMOS 21 constituting the shift register 11 for generating a signal to the buffer circuit 17 are respectively formed in a second P type well 23 and the first N type well 24.

A ground potential is supplied to the second P type well 23 through a P type diffusion layer 29 from the outside. The NMOS 18 constituting the buffer circuit 17 and the NMOS 20 constituting the shift register 11 are formed in the different P type wells, and separated from each other by the first N type well 24. Accordingly, an effect of through-current flowing into the second P type well is not mixed in a low level of a control signal φH supplied to the switch 14.

As described above, since the P type diffusion layer 26 to which a ground level for the buffer circuit 17 is supplied and the P type diffusion layer 29 to which a ground level for the shift register 11 is supplied are electrically separated from each other, it is possible to prevent an effect of noise.

Figure 3A:
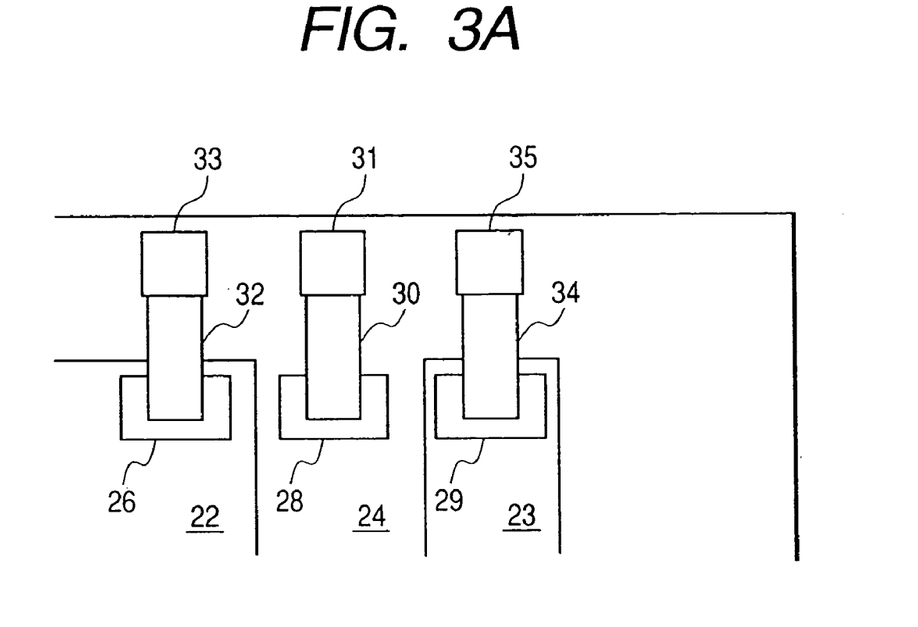
FIGS. 3A and 3B are conceptual diagrams showing a planar structure of the photoelectric conversion device of the first embodiment of the invention.

FIG. 3A is a partial plan view of the photoelectric conversion device of the embodiment, showing an optimum structure for preventing the effect of noise. The N type well 24 is connected to an external input pad 31 through a metal wiring 30. A power supply potential VDD is supplied to the external input pad 31 from a not-shown external voltage source of low impedance. The first P type well 22 is connected to an external input pad 33 through a metal wiring 32. The external input pad 33 is connected to a not-shown external ground line. The second P type well 23 is connected to an external input pad 35 through a metal wiring 34. The external input pad 35 is connected to a not-shown external ground line. Thus, the first P type well 22 and the second P type well 23 are connected to the external ground lines through the different metal wirings of low resistance and the different external input pads 36 to prevent mutual interferences. Therefore, the through-current flowing into the second P type well 23 has no effects on the potential of the first P type well 22.

Figure 3B:
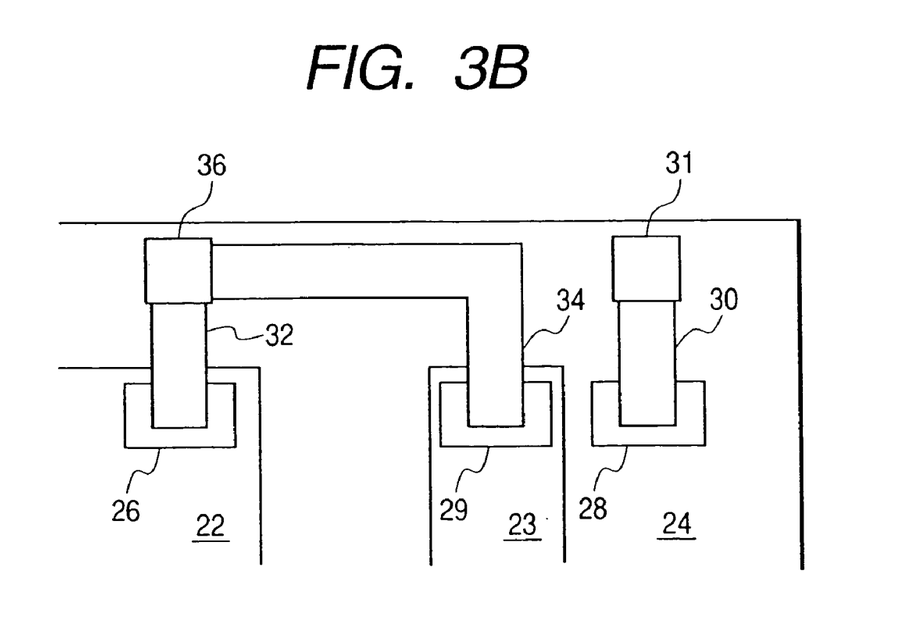

Furthermore, as shown in FIG. 3B, even when an external input pad 36 is made common, and metal wirings of low resistance are separated in the midway and connected to the first and second P type wells, there are similar technological advantages. The ground potentials supplied to the first and second P type wells need not be equal, but may be completely different. Also in this case, the effects of the embodiment are apparently obtained.

Second Embodiment

Figure 4:
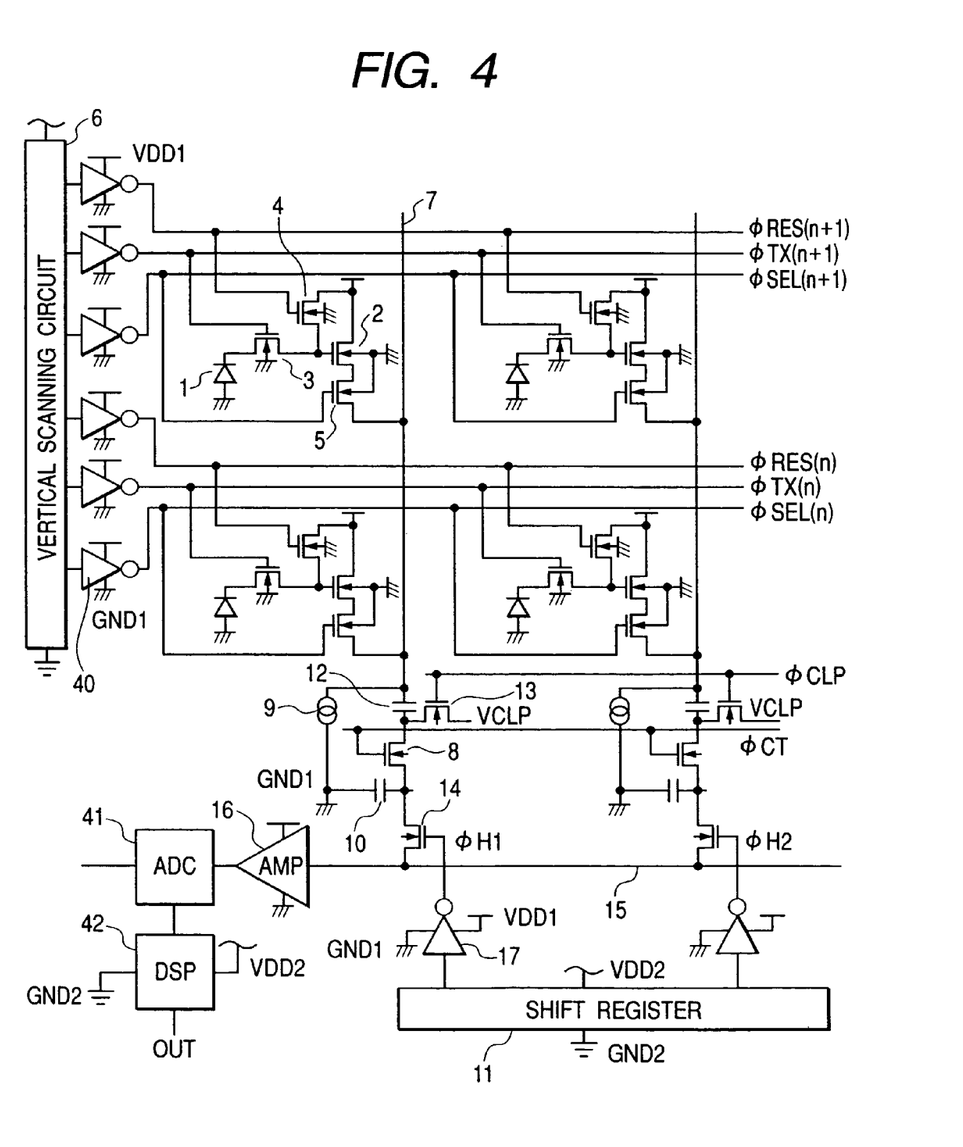
FIG. 4 is a conceptual diagram showing an equivalent circuit of a photoelectric conversion device according to a second embodiment of the present invention.

The second embodiment of the present invention will be described in detail. FIG. 4 is a conceptual diagram showing an equivalent circuit of a photoelectric conversion device of the second embodiment. The photoelectric conversion device shown in FIG. 4 is formed on a single semiconductor substrate by, for example a CMOS process. Description of circuit components having roles similar to those of FIG. 1 will be omitted.

A difference from FIG. 1 is that φTX, φRES, φSEL supplied to a transfer switch 3, a reset switch 4 and a select switch 5 of a pixel are generated by a buffer circuit 40 to which a scanning signal of a vertical scanning circuit 6 as a logic circuit is inputted. In this case, the vertical scanning circuit 6 includes a shift register and uses a separate buffer circuit 40.

In the drawing, two kinds of supply paths of a power source VDD are shown. As described later, these are power supply voltage supply paths which do not interfere with each other. Additionally, an A/D converter circuit 41 for subjecting an output signal from an output amplifier 16 to analog/digital conversion, and a digital signal processor (DSP) 42 which is a logic circuit for subjecting a digital image signal to a predetermined arithmetic operation are disposed in the same semiconductor substrate. The DSP 42 is connected to a power supply potential supply path VDD 2 and a ground potential supply path GND 2. During the operation of the DSP 42, a voltage reduction occurs due to through-current, generating noise in actually supplied power supply and ground potentials. Since a power source of a buffer circuit 40 is connected to a power supply potential supply path VDD 1 and a ground potential supply path GND 1 different from those of the DSP 42, there are no effects of noise generated in the DSP 42. If noise is mixed in to lower a high level in a high period of the φTX, there is a danger of a reduction in transfer efficiency of photoelectric charge. This problem is solved by employing the constitution of the embodiment. Similarly, since there are no effects of DSP operation noise on the φRES, φSEL, a signal can be normally read out from the pixel.

Figure 5:
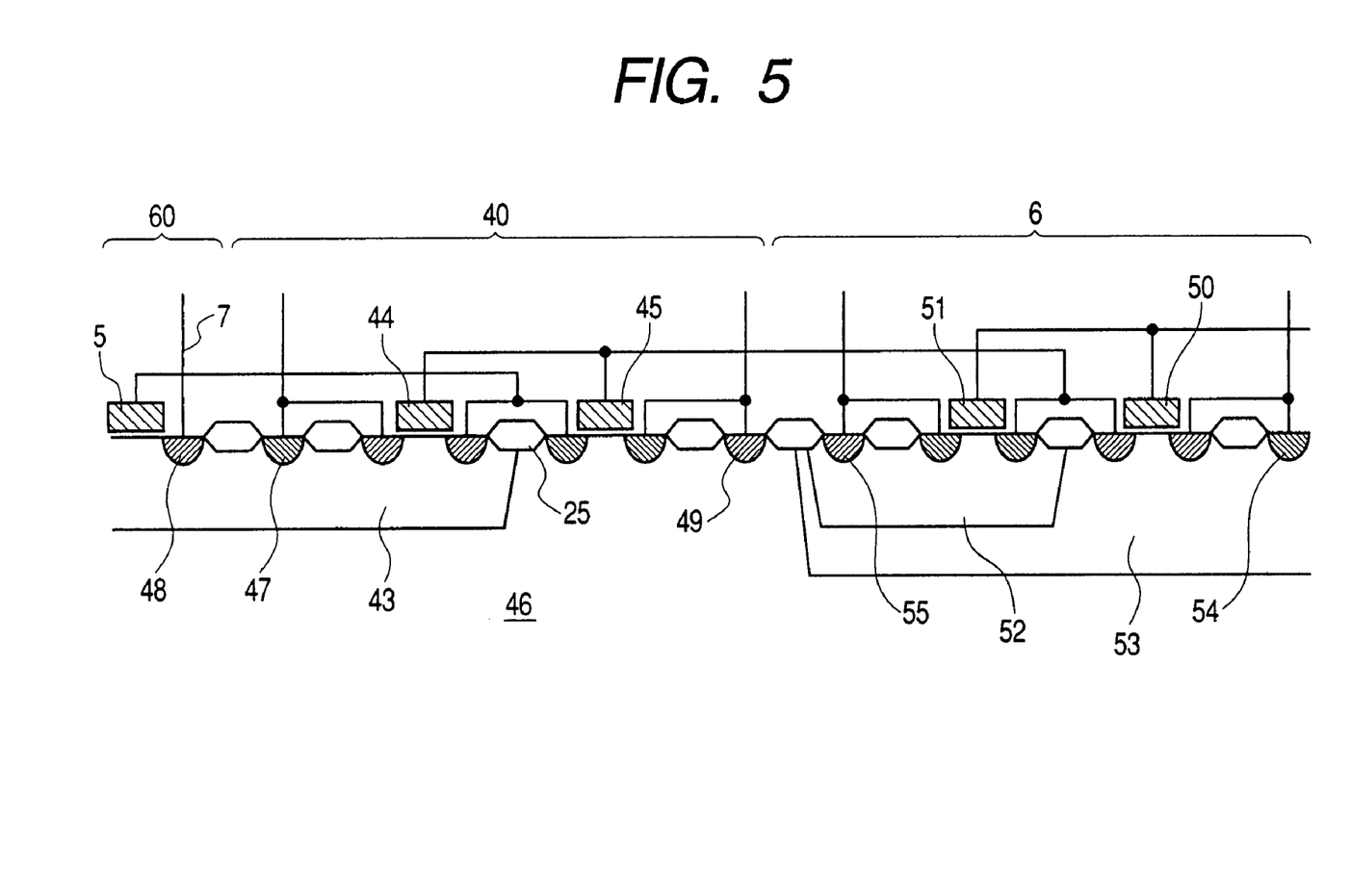
FIG. 5 is a conceptual diagram showing a sectional structure of the photoelectric conversion device of the second embodiment of the invention.

FIG. 5 is a conceptual diagram showing a partial sectional structure of the select switch 60, the buffer circuit 40 and the vertical scanning circuit 6. The select switch 60 is constituted of an NMOS 5 formed in a first P type well 43. A ground potential is supplied to the first P type well 43 through a P type diffusion layer 47 from the outside. An N type diffusion layer 48 which is a source or a drain of the select switch 60 is connected to a vertical output line 7. An NMOS 44 of the buffer circuit is formed in the first P type well 43, and a PMOS 45 is formed in a first N type well 46. A power supply potential VDD is supplied to the first N type well 46 through an N type diffusion layer 49. An NMOS 50 and a PMOS 51 constituting the vertical scanning circuit 6 are respectively formed in a second P type well 53 and a second N type well 52. In this case, a ground potential is supplied to the second P type well 53 through a P type diffusion layer 54. A power supply potential is supplied to the second N type well 52 through an N type diffusion layer 55. The NMOS 44 constituting the buffer circuit and the NMOS 50 constituting the shift register are formed in the different P type wells, and the PMOS 45 constituting the buffer circuit and the PMOS 51 constituting the vertical scanning circuit are formed in the different N type wells. Accordingly, an effect of through-current flowing into the second P type well 53 and the second N type well 52 caused by the operation of the logic circuit such as the shift register 6 is not mixed in a high level and a low level of a control signal φSEL of the select switch.

The first and second N type wells are separated from each other by the reverse conductive well 53, and connected to external voltage sources through wirings of low resistance by a method similar to that of the first embodiment. Accordingly, there are no electrical interferences with each other. The same can be said about the first and second P type wells.

As described above, since the P type diffusion layer 47 to which a ground level for the buffer circuit 40 is supplied and the P type diffusion layer 54 to which a ground level for the shift register 11 is supplied are electrically separated from each other, it is possible to prevent an effect of noise.

Since the P type diffusion layer 47 to which a ground level for the buffer circuit 40 is supplied and a semiconductor area to which a ground level for the DSP 42 is supplied are electrically separated from each other, it is possible to prevent an effect of noise.

Additionally, since the P type diffusion layer 26 to which a ground level for the buffer circuit 19 is supplied and the semiconductor area to which a ground level for the DSP 42 is supplied are electrically separated from each other, it is possible to prevent an effect of noise.

The ground potentials supplied to the first and second N type wells need not be equal, but may be completely different. Also in this case, the effects of the embodiment are apparently obtained.

Third Embodiment

The third embodiment of the present invention will be described in detail.

Figure 6:
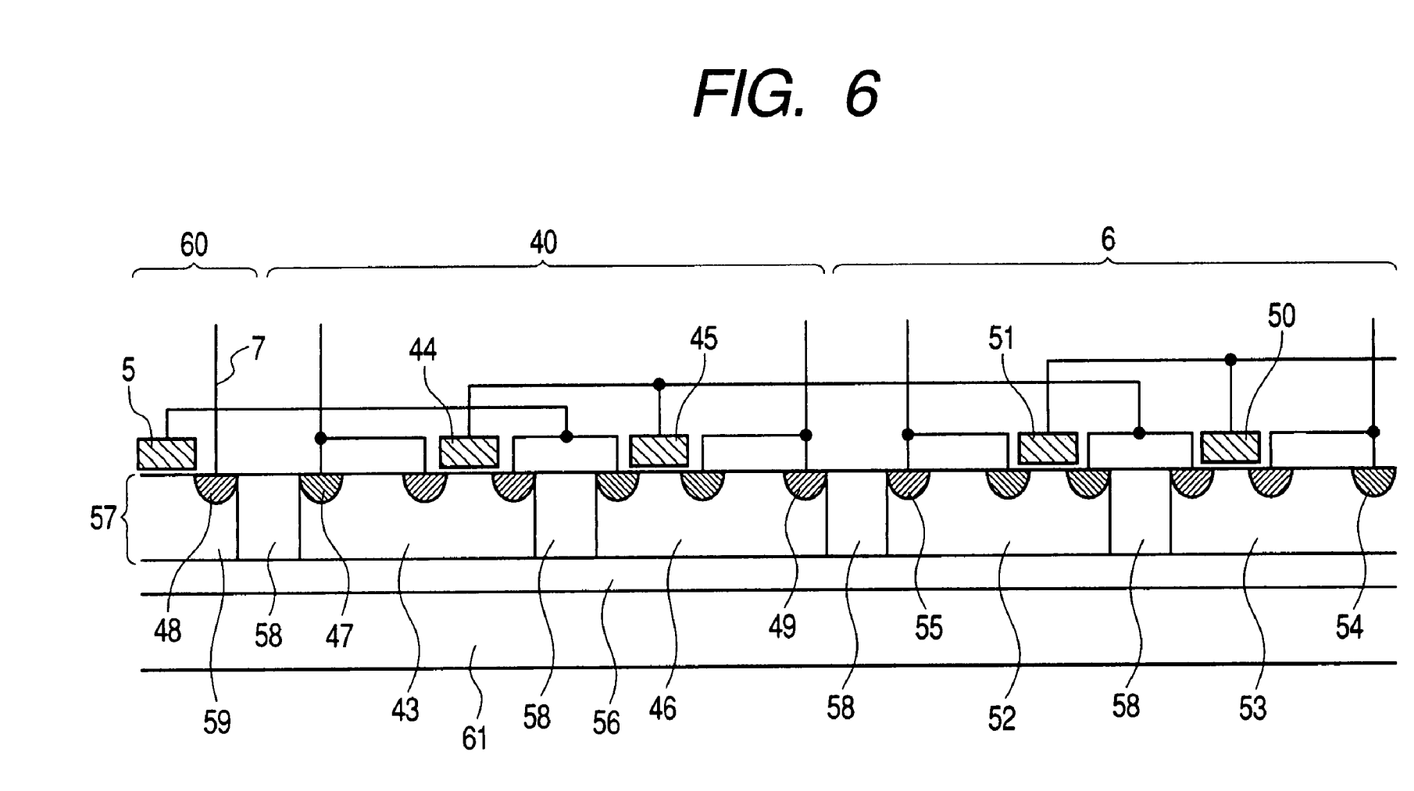
FIG. 6 is a conceptual diagram showing a sectional structure of a photoelectric conversion device according to a third embodiment of the present invention.

An equivalent circuit of a photoelectric conversion device of the embodiment is similar to the second embodiment of FIG. 4. However, the separation of the first and second N type wells and the separation of the first and second P type wells of the second embodiment are realized not based on PN junctions but based on insulating layer formation using a silicon on insulator (SOI) substrate and trench processing. FIG. 6 is a conceptual diagram showing a partial sectional structure of a select switch 60, a buffer circuit 40 and a vertical scanning circuit 6 of the embodiment. There is a semiconductor layer 57 on an insulating layer 56, and the select switch 60, the buffer circuit 40 and the vertical scanning circuit 6 are formed on the semiconductor layer 57.

The components are separated from one another in a horizontal direction by an insulating layer 58 of trench processing. By a method similar to that of the first embodiment, a first P type well 43, a second P type well 53 and a third P type well 59 are connected to external ground potentials through wirings of low resistance. Accordingly, there are no electrical interferences. The same can be attained to a first N type well 46 and a second N type well 52.

Through-current flowing into the second P type well 53 and the second N type well 52 caused by an operation of a logic circuit is not mixed into a high level and a low level of a control signal φSEL of the select switch, and thus there are no effects of the current mixing-in. Additionally, separation is also made from a substrate 61 by the insulating layer 56, whereby a large effect is provided against noise incursion from the outside.

In the foregoing description of the first to third embodiments, the semiconductor area to which the ground potential for the buffer circuit is supplied and the semiconductor area to which the ground level for the logic circuit is supplied are electrically separated from each other. However, a constitution may be employed where a semiconductor area to which power supply voltage for the buffer circuit is supplied and a semiconductor area to which power supply voltage for the logic circuit is supplied are electrically separated from each other.

Fourth Embodiment

Figure 7:
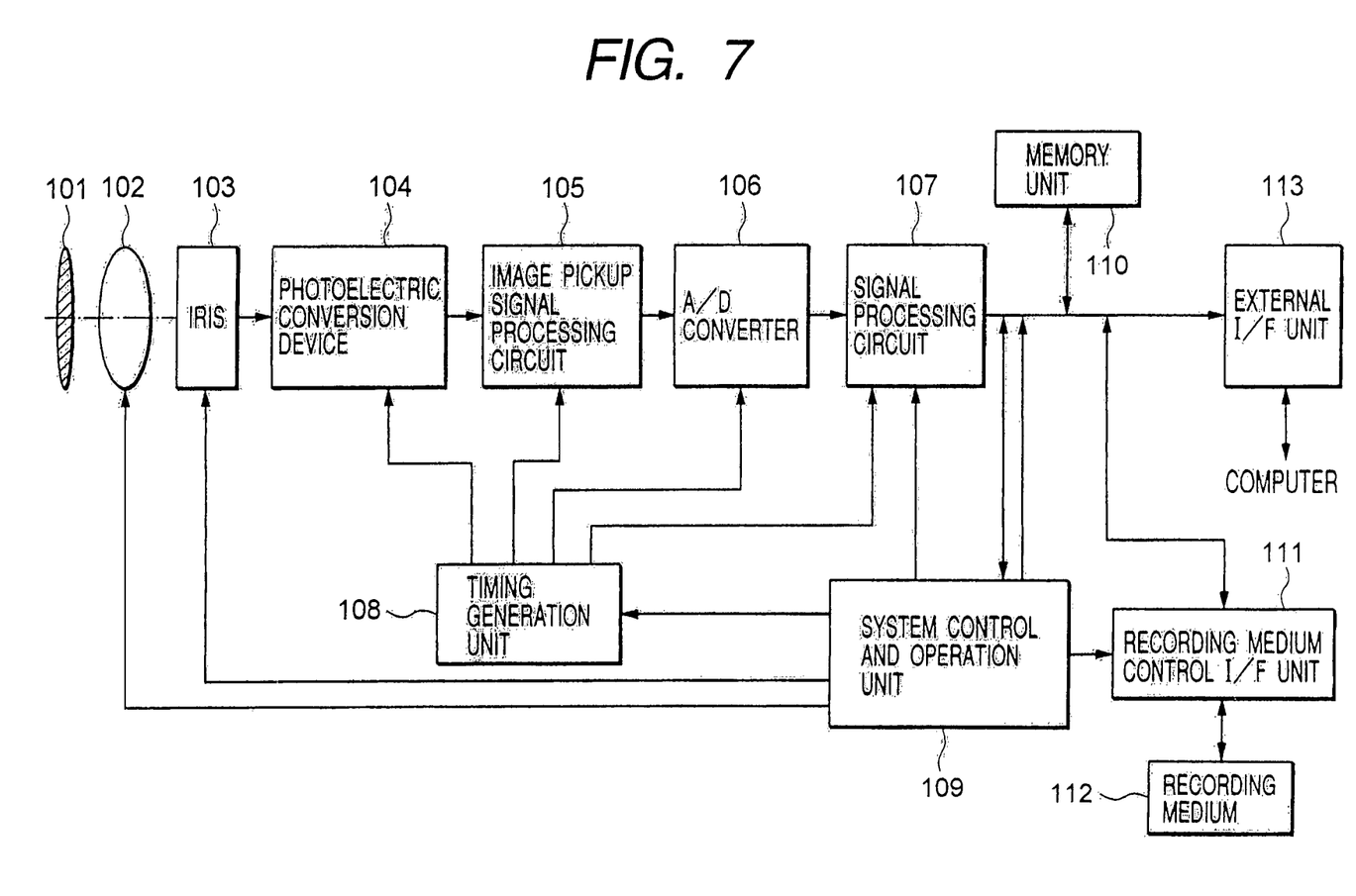
FIG. 7 is a view showing an image pickup device using one of the photoelectric conversion devices of the first to third embodiments.

Description will be made of an image pickup device using one of the photoelectric conversion devices of the foregoing first to third embodiments by referring to FIG. 7.

In the drawing, a reference numeral 101 denotes a barrier serving both as a lens protector and a main switch, 102 denotes a lens for forming an optical image of an object in a photoelectric conversion device 104, 103 denotes an iris for varying the amount of light passed through a lens 2, 104 denotes the photoelectric conversion device for picking up the object image-formed by the lens 102 as an image signal, 105 denotes an image pickup signal processing circuit including a gain variable amplifier for amplifying the image signal outputted from the photoelectric conversion device 104 and a gain correction circuit for correcting a gain value, 106 denotes an A/D converter for subjecting the image signal outputted from the photoelectric conversion device 104 to analog/digital conversion, 107 denotes a signal processing circuit for making various corrections for image data outputted from the A/D converter 106 or compressing the data, 108 denotes a timing generation unit for outputting various timing signals to the photoelectric conversion device 104, the image pickup signal processing circuit 105, the A/D converter 106, and the signal processing circuit 107, 109 denotes a system control and operation unit for controlling various arithmetic operations and the entire still video camera, 110 denotes a memory unit for temporarily storing the image data, 111 denotes an interface unit for recording/reproducing in a recording medium, 112 denotes a detachable recording medium such as a semiconductor memory for recording/reproducing the image data, and 113 denotes an interface unit for communicating with an external computer etc.

In the case of using the photoelectric conversion device of the second embodiment, the image pickup signal processing circuit 105, the A/D converter 6 and the signal processing circuit 7 (DSP) are formed in the photoelectric conversion device.

Next, description will be made of an operation of the image pickup device of the aforementioned constitution in photographing.

When the barrier 101 is opened, a main power source is turned ON, then a power source of a control system is turned ON, and further a power source of an image pickup system circuit such as the A/D converter 106 is turned ON.

Then, to control the amount of exposure, the system control and operation unit 109 releases the iris 103, and a signal outputted from the photoelectric conversion device 104 is converted by the A/D converter 106, and then inputted to the signal processing circuit 107.

An exposure arithmetic operation is carried out by the system control and operation unit 109 based on the data of the above.

Brightness is determined based on a result of the photometric operation. The system control and operation unit 109 controls the iris in accordance with a result of the determination.

Subsequently, based on a signal outputted from the photoelectric conversion device 104, a high-frequency component is taken out to calculate a distance to the object at the system control and operation unit 109. Then, the lens is driven to determine an in-focus or out-of focus state. When the out-of focus state is determined, the lens is driven again to carry out distance measurement.

After verification of the in-focus state, real exposure is started.

After an end of the exposure, the image signal outputted from the photoelectric conversion device 104 is subjected to A/D conversion at the A/D converter 106, passed through the signal processing circuit 107, and written in the memory unit by the system control and operation unit 109.

Subsequently, the data stored in the memory unit 110 is passed through the recording medium control I/F unit and recorded in the detachable recording medium 112 such as a semiconductor memory under control of the system control and operation unit 109.

The data may be directly inputted through the external I/F unit 113 to the computer or the like to process the image.

Many widely different embodiments of the present invention may be constructed without departing from scope of the present invention. It should be understood that the present invention is not limited to the specific embodiments described in the specification, except as defined in the appended claims.

What is claimed is:

1. A photoelectric conversion apparatus including a single semiconductor substrate on which are arranged a plurality of photoelectric conversion elements, a read-out circuit unit that reads out analog signals from said plurality of photoelectric conversion elements, a buffer circuit unit that drives a switch included in said read-out circuit unit, and a logic circuit unit that processes a digital signal to supply a pulse to said buffer circuit unit, said apparatus comprising:
- a second semiconductor area of a first conductivity type, formed in a first semiconductor area of said first conductivity type to which a ground level for said buffer circuit unit is supplied; and
- a fourth semiconductor area of said first conductivity type, formed in a third semiconductor area of said first conductivity type to which a ground level for said logic circuit unit is supplied,
- wherein said first semiconductor area and said third semiconductor area are separated from each other by a fifth semiconductor area of a second conductivity type, and
- wherein said logic circuit unit is connected to said buffer circuit unit, and said buffer circuit unit is connected to said switch included in said read-out circuit unit.

2. An apparatus according to claim 1, wherein a signal from said logic circuit unit is input to said buffer circuit unit, and one terminal of said switch is connected to a holding capacitor for holding temporarily an analog signal from a photoelectric conversion element.

3. An apparatus according to claim 1, wherein said buffer circuit unit and said logic circuit unit are arranged to form a scanning circuit for supplying a sequential pulse.

4. An apparatus according to claim 1, further comprising an analog-digital conversion circuit, which converts a signal from said read-out circuit unit into a digital signal, wherein said logic circuit unit subjects said signal from said analog-digital conversion circuit to image processing.

5. An apparatus according to claim 1, further comprising a sixth semiconductor area to which a ground level for said read-out circuit unit is supplied, formed in said first semiconductor area.

6. A photoelectric conversion apparatus including a single semiconductor substrate on which are arranged a plurality of photoelectric conversion elements, a read-out circuit unit that reads out analog signals from said plurality of photoelectric conversion elements, a buffer circuit unit that drives a switch included in said read-out circuit unit, and a logic circuit unit that processes a digital signal to supply a pulse to said buffer circuit unit, said apparatus comprising:
- a second semiconductor area of a first conductivity type, formed in a first semiconductor area of the first conductivity type to which a power supply level for said buffer circuit unit is supplied; and
- a fourth semiconductor area of said first conductivity type, formed in a third semiconductor area of said first conductivity type to which a power supply level for said logic circuit unit is supplied,
- wherein said first semiconductor area and said third semiconductor area are separated from each other by a fifth semiconductor area of a second conductivity type, and
- wherein said logic circuit unit is connected to said buffer circuit unit, and said buffer circuit unit is connected to said switch included in said read-out circuit unit.

7. An apparatus according to claim 6, wherein a signal from said logic circuit unit is input to said buffer circuit unit, and one terminal of said switch is connected to a holding capacitor for holding temporarily an analog signal from a photoelectric conversion element.

8. An apparatus according to claim 6, wherein said buffer circuit unit and said logic circuit unit are arranged to form a scanning circuit for supplying a sequential pulse.

9. An apparatus according to claim 6, further comprising an analog-digital conversion circuit that converts a signal from said read-out circuit unit into a digital signal, wherein said logic circuit unit subjects said signal from said analog-digital conversion circuit to image processing.

10. An apparatus according to claim 6 or 7, further comprising a sixth semiconductor area to which a power supply level for said read-out circuit unit is supplied, formed in said first semiconductor area.

11. A photoelectric conversion apparatus including a single semiconductor substrate on which are arranged a plurality of photoelectric conversion elements, a read-out circuit unit that reads out analog signals from said plurality of photoelectric conversion elements, a buffer circuit unit that drives a switch included in said read-out circuit unit, and a logic circuit unit that processes a digital signal to supply a pulse to said buffer circuit unit, said apparatus comprising:
- a second semiconductor area of a first conductivity type, formed in a first semiconductor area of said first conductivity type to which a ground level for said buffer circuit unit is supplied; and
- a fourth semiconductor area of said first conductivity type, formed in a third semiconductor area of said first conductivity type to which a ground level for said logic circuit unit is supplied,
- wherein said first semiconductor area and said third semiconductor area are separated from each other by an insulation area, and
- wherein said logic circuit unit is connected to said buffer circuit unit, and said buffer circuit unit is connected to said switch included in said read-out circuit unit.

12. A photoelectric conversion apparatus including a single semiconductor substrate on which are arranged a plurality of photoelectric conversion elements, a read-out circuit unit that reads out analog signals from said plurality of photoelectric conversion elements, a buffer circuit unit that drives a switch included in said read-out circuit unit, and a logic circuit unit that processes a digital signal to supply a pulse to said buffer circuit unit, said apparatus comprising:
- a second semiconductor area of a first conductivity type, formed in a first semiconductor area of said first conductivity type to which a power supply level for said buffer circuit unit is supplied; and
- a fourth semiconductor area of said first conductivity type, formed in a third semiconductor area of said first conductivity type to which a power supply level for said logic circuit unit is supplied,
- wherein said first semiconductor area and said third semiconductor area are separated from each other by an insulation area, and
- wherein said logic circuit unit is connected to said buffer circuit unit, and said buffer circuit unit is connected to the switch included in said read-out circuit unit.

13. A photoelectric conversion apparatus according to one of claims 1, 6, 11, and 12, wherein said photoelectric conversion apparatus is incorporated in an image pickup apparatus that includes:
- a memory, which stores a signal from said photoelectric conversion apparatus; and
- a timing generation unit, which generates a timing signal to said photoelectric conversion apparatus.

* * * * *